United States Patent
Fukuoka

(10) Patent No.: US 6,553,537 B1
(45) Date of Patent: Apr. 22, 2003

(54) REED-SOLOMON DECODING APPARATUS AND CONTROL METHOD THEREFOR

(75) Inventor: Toshihiko Fukuoka, Shijyonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/457,727

(22) Filed: Dec. 10, 1999

(30) Foreign Application Priority Data

Dec. 11, 1998 (JP) .......................................... 10-353319

(51) Int. Cl.$^7$ ............................................. H03M 13/00
(52) U.S. Cl. ...................................................... 714/784
(58) Field of Search ................................ 714/784, 785, 714/FOR 102

(56) References Cited

U.S. PATENT DOCUMENTS

| | | | |
|---|---|---|---|
| 4,413,339 A | * 11/1983 | Riggle et al. | 714/765 |
| 5,099,482 A | * 3/1992 | Cameron | 714/784 |
| 5,365,529 A | 11/1994 | Mester | |
| 5,414,719 A | 5/1995 | Iwaki et al. | |
| 5,610,929 A | * 3/1997 | Yamamoto | 714/758 |
| 5,818,854 A | 10/1998 | Meyer | |
| 6,031,875 A | 2/2000 | Im | |
| 6,122,766 A | 9/2000 | Fukuoka et al. | |

FOREIGN PATENT DOCUMENTS

| | | |
|---|---|---|
| JP | 5-315975 | 11/1993 |
| JP | 10-135846 | 5/1998 |
| JP | 10-215188 | 8/1998 |
| KP | 98-15800 | 5/1998 |
| KP | 98-30310 | 7/1998 |
| KP | 0056885 | 12/2001 |

* cited by examiner

Primary Examiner—Albert Decady
Assistant Examiner—Matthew C. Dooley
(74) Attorney, Agent, or Firm—Wenderoth, Lind & Ponack, L.L.P.

(57) ABSTRACT

The present invention provides a Reed-Solomon decoding apparatus comprising a device for monitoring occurrence of an error beyond an error correction capability and a degree of error correction. The Reed-Solomon decoding apparatus of the present invention comprises a Reed-Solomon decoder and a correction state monitor. The correction state monitor detects a process error in a Eucledean algorithm computer and a chain retrieval unit in the Reed-Solomon decoder, and generates a signal indicating the degree of error in input data.

17 Claims, 10 Drawing Sheets

REED-SOLOMON DECODING APPARATUS AND CONTROL METHOD THEREFOR

FIELD OF THE INVENTION

The present invention relates to an apparatus for decoding a multiple error correcting Reed-Solomon code, i.e., a Reed-Solomon decoding apparatus, and a method for controlling the Reed-Solomon decoding apparatus.

BACKGROUND OF THE INVENTION

As codes which enable multiple error correction for storage information in various mass storages, transmission information in high-speed communication and the like, Reed-Solomon codes are widely known.

The Reed-Solomon code is a code on the Galois field which contains roots $\alpha$ of W(z) (primitive polynomial)=0 as primitive elements, and is known as one of block error correcting codes. Here, consider a Reed-Solomon code of a code length $n=2^m-1$, assuming that roots $\alpha$ as primitive elements of a Galois field $GM^{2m}$ are $\alpha^0, \alpha^1, \ldots, \alpha 2^m-1$. According to this code, m bits is one processing unit, i.e., one symbol. The amount of original information is (n−2t) symbols. In the following description, suppose that m=8 and one symbol is represented as 8 bits, i.e., 1 byte. A received word of one packet comprises n pieces of symbols. When t=8, it is possible to correct errors of 8 symbols.

Generally, decoding of a Reed-Solomon code is performed in accordance with the following procedures, i.e., syndrome computing, computations of an error evaluation polynomial and an error location polynomial, computations of an error location and an error magnitude, and error correction. A detail of the decoding method is disclosed in Japanese Published Patent Application Hei. 10-135846.

Usually, error correction according to the Reed-Solomon code has a significantly high correction capability. Moreover, the correction process is performed by utilizing not only the Reed-Solomon code alone but also in combination with a convolution code and an interleaving process, or performed dually with the Reed-Solomon code itself as a product code, whereby an error free state having few errors is obtained on a real transmission path.

However, when the state of the transmission path is so bad as to exceed the error correction capability for any reason, there is a possibility of error correction not being performed at all or improper correction being performed in the normal Reed-Solomon decoding process.

Conventionally, in the Reed-Solomon decoding process, the maximum value of the number of error corrections is determined for a transmission path in the expected worst state, whereby the error free condition is usually realized. However, in the conventional Reed-Solomon decoding process, when the number of error corrections exceeds the maximum value and the error correction cannot be performed, the fact that the correction is impossible is merely notified by a flag. The flag notifying that the correction is impossible is usually transmitted to a monitor for monitoring an error at the error correction, different from LSI including an apparatus for performing the Reed-Solomon decoding process. However, the monitor is used only for a test at the manufacture of LSIs. Therefore, when the Reed-Solomon decoding process is performed in a practical system, there is no means for monitoring an error at the error correction.

Therefore, even when a state exceeding the error correction capability occurs frequently, processes for dealing with that state are not performed at all in the practical LSI performing the Reed-Solomon decoding process. Further, there is no index for notifying LSI whether the error correction is performed or not, and if performed, to what extent the error correction is correctly performed.

SUMMARY OF THE INVENTION

It is an object of the present invention to provide a Reed-Solomon decoding apparatus comprising a device for monitoring occurrence of errors beyond an error correction capability and a degree of error correction, a method for controlling the Reed-Solomon decoding apparatus, and a storage medium containing a program for performing the control.

Other objects and advantages of the present invention will become apparent from the detailed description and specific embodiments described are provided only for illustration since various additions and modifications within the spirit and scope of the invention will be apparent to those of skill in the art from the detailed description.

A Reed-Solomon decoding apparatus according to a 1st aspect of the present invention comprises: a Reed-Solomon decoder for performing error correction for input data with a Reed-Solomon code; and a correction state monitor for detecting a process error in the error correction by the Reed-Solomon decoder and monitoring a degree of error in the input data, the Reed-Solomon decoder comprises: a syndrome computer for computing a syndrome from the input data; a Eucledean algorithm computer for computing an error location polynomial and an error evaluation polynomial using the syndrome; an error location computer for computing an error location indicating an error byte in the input data form the error location polynomial and the error evaluation polynomial; and an error corrector for correcting the input data by using the error location and an error magnitude indicating an error bit among bits constituting the error byte indicated by the error location, the error magnitude being computed by either of the Eucledean algorithm computer or the error location computer by using the error location polynomial and the error evaluation polynomial, and the correction state monitor monitors the Eucledean algorithm computer and the error location computer, generates a signal indicating the presence or absence of a process error in each of the Eucledean algorithm computer and the error location computer, and generates a signal indicating the degree of error in the input data from the error location and the error magnitude.

According to a 2nd aspect of the present invention, in the Reed-Solomon decoding apparatus of the 1st aspect, the correction state monitor comprises: an error bit number counter for counting the number of the error bits indicated by the error magnitude; and a synchronous signal counter for counting synchronous byte suggestion signals which are output in synchronization with synchronous signals of the input data, and the signal indicating the degree of error in the input data includes the total number of bits in data which is input to the Reed-Solomon decoding apparatus and the number of the error bits which are counted by the error bit number counter, while the synchronous signal counter counts a predetermined number of the synchronous byte suggestion signals.

According to a 3rd aspect of the present invention, in the Reed-Solomon decoding apparatus of the 1st aspect, the correction state monitor comprises: an error bit number counter for counting the number of the error bits indicated by the error magnitude; a synchronous signal counter for counting synchronous byte suggestion signals which are output in synchronization with synchronous signals of the input data; and a bit error rate computer for computing a bit error rate from the total number of bits in data which is input to the Reed-Solomon decoding apparatus and the number of the error bits which are counted by the error bit number counter, while the synchronous signal counter counts a predetermined number of synchronous byte suggestion signals, and the signal indicating the degree of error in the input data includes the bit error rate.

According to a 4th aspect of the present invention, in the Reed-Solomon decoding apparatus of the 3rd aspect, the bit error rate computer comprises: a divider for dividing the number of the error bits by the total number of bits in the input data.

According to a 5th aspect of the present invention, in the Reed-Solomon decoding apparatus of the 4th aspect, the bit error rate computer comprises: a constant output unit for previously computing the total number of bits in data which is to be input to the Reed-Solomon decoding apparatus while the predetermined number of synchronous byte suggestion signals are counted, and when the synchronous signal counter counts the predetermined number of synchronous byte suggestion signals, outputting the previously computed total number of bits.

According to a 6th aspect of the present invention, in the Reed-Solomon decoding apparatus of the 3rd aspect, the bit error rate comprises: a determining unit, wherein plural assumable ranges of the error bit number are previously set, for determining a range including the number of the error bits which are counted by the error bit number counter while the predetermined number of synchronous byte suggestion signals are counted, in the set ranges; and an error rate output unit for previously computing bit error rates from values, each of which is arbitrarily selected from each of the ranges set in the determining unit, and the total number of bits in the input data, and outputting a bit error rate corresponding to the range determined by the determining unit form the previously computed bit error rates.

According to the 7th aspect of the present invention, in the Reed-Solomon decoding apparatus of the 2nd aspect, the correction state monitor comprises an error symbol number counter for counting the number of the error bytes indicated by the error location, and the signal indicating the degree of error in the input data includes the total number of symbols in data which is input to the Reed-Solomon decoding apparatus while the synchronous signal counter counts the predetermined number of synchronous byte suggestion signals, and the number of the error symbols which are counted by the error symbol number counter while the synchronous byte suggestion signals are counted.

According to an 8th aspect of the present invention, in the Reed-Solomon decoding apparatus of any of the 1st and 3rd to 6th aspects, the correction state monitor comprise: an error symbol number counter for counting the number of the error bytes indicated by the error location; and a symbol error rate computer for computing a symbol error rate from the total number of symbols in data which is input to the Reed-Solomon decoding apparatus while a predetermined number of synchronous byte suggestion signals which are output in synchronization with synchronous signals of the input data, are counted, and the number of the error symbols which are counted by the error symbol number counter while the predetermined number of synchronous byte suggestion signals are counted, and the signal indicating the degree of error in the input data includes the symbol error rate.

According to a 9th aspect of the present invention, in the Reed-Solomon decoding apparatus of the 8th aspect, the symbol error rate computer comprises: a divider for dividing the number of the error symbols by the total number of symbols in the input data.

According to a 10th aspect of the present invention, in the Reed-Solomon decoding apparatus of the 9th aspect, the symbol error rate computer comprises: a constant output unit for previously computing the total number of symbols in data which is to be input to the Reed-Solomon decoding apparatus while the predetermined number of synchronous byte suggestion signals are counted, and when the synchronous signal counter counts the predetermined number of synchronous byte suggestion signals, outputting the previously computed total number of symbols.

According to an 11th aspect of the present invention, in the Reed-Solomon decoding apparatus of the 8th aspect, the symbol error rate computer comprises: a determining unit, wherein plural assumable ranges of the error symbol number are previously set, for determining a range including the number of the error symbols which are counted by the error symbol number counter while the predetermined number of synchronous byte suggestion signals are counted, in the set ranges; and an error range output unit for previously computing symbol error rates from values, each of which is arbitrarily selected from each of the ranges set in the determining unit, and the total number of symbols in the input data, and outputting a symbol error rate corresponding to the range determined by the determining unit from the previously computed symbol error rates.

According to a 12th aspect of the present invention, a method for controlling a Reed-Solomon decoding apparatus which performs error correction for input data with a Reed-Solomon code, comprises: a syndrome computing step of computing a syndrome from the input data; a Eucledean algorithm computing step of computing an error location polynomial and an error evaluation polynomial using the syndrome; an error location computing step of computing an error location indicating an error byte in the input data from the error location polynomial and the error evaluation polynomial; an error magnitude computing step of computing an error magnitude indicating an error bit among bits constituting the error byte indicated by the error location by using the error location polynomial and the error evaluation polynomial; an error correcting step of correcting the input data using the error location and the error magnitude; and a correction state montiroing step of monitoring the Eucledean algorithm computing step, and the error location computing step, and the error magnitude computing step, generating a signal indicating the presence or absence of a process error in each step, and generating a signal indicating the degree of error in the input data, from the error location and the error magnitude.

According to a 13th aspect of the present invention, in the Reed-Solomon decoding apparatus control method of the 12th aspect, the correction state monitoring step comprises: an error bit number counting step of counting the number of the error bits indicated by the error magnitude; a synchronous signal counting step of counting synchronous byte suggestion signals which are output in synchronization with synchronous signals of the input data; and a bit error rate computing step of computing a bit error rate from the total number of bits in data which is input to the Reed-Solomon decoding apparatus and the number of the error bits which are counted in the error bit number counting step, while a predetermined number of the synchronous byte suggestion signals are counted in the synchronous signal counting step, and the signal indicating the degree of error in the input data includes the bit error rate.

According to a 14th aspect of the present invention, in the Reed-Solomon decoding apparatus control method of the 13th aspect, the bit error rate computing step comprises: a determining step of previously set plural assumable ranges of the error bit number, and determining a range including the number of the error bits which are counted in the error bit number counting step while the predetermined number of synchronous byte suggestion signals are counted, in the set ranges; and an error rate outputting step of previously computing bit error rates from values, each of which is arbitrarily selected from each of the ranges set in the determining step, and the total number of bits in the input data, and when a range is determined in the determining step, outputting a bit error rate corresponding to the determined range from the previously computed bit error rates. According to a 15th aspect of the present invention, in the Reed-Solomon decoding apparatus control method of any of the 12th to 14th aspects, the correction state monitoring step comprises: an error symbol number counting step of counting the number of the error bytes indicated by the error location; and a symbol error rate computing step of computing a symbol error rate from the total number of symbols in data which is input to the Reed-Solomon decoding apparatus while a predetermined number of synchronous byte suggestion signals which are output in synchronization with synchronous signals of the input data, are counted, and the number of the error symbols counted in the error symbol number counting step while the predetermined number of synchronous byte suggestion signals are counted, and the signal indicating the degree of error in the input data includes the symbol error rate.

According to a 16th aspect of the present invention, in the Reed-Solomon decoding apparatus control method of the 15th aspect, the symbol error rate computing step comprises: a determining step of previously setting plural assumable ranges of the error symbol number, and determining a range including the number of the error symbols counted in the error symbol number counting step while the predetermined number of synchronous byte suggestion signals are counted, in the set ranges; and an error rate outputting step of previously computing symbol error rates from values, each of which is arbitrarily selected from each of the ranges set in the determining step, and the total number of symbols in the input data, and when a range is determined in the determining step, outputting a symbol error rate corresponding to the determine range, from the previously computed symbol error rates.

According to a 17th aspect of the present invention, in a computer-readable storage medium storing a code of a program for controlling a Reed-Solomon decoding apparatus which performs error correction for input data with a Reed-Solomon code, the code of the program includes: a code of a syndrome computing step of computing a syndrome from the input data; a code of a Eucledean algorithm computing step of computing an error location polynomial and an error evaluation polynomial using the syndrome; a code of an error location computing step of computing an error location, indicating an error byte in the input data, from the error location polynomial and the error evaluation polynomial; a code of an error magnitude computing step of computing an error magnitude indicating an error bit among bits constituting the error byte indicated by the error location; a code of an error correcting step of correcting the input data using the error location and the error magnitude; and a code of a correction state monitoring step of monitoring the Eucledean algorithm computing step, the error location computing step, and the error magnitude computing step, generating a signal indicating the presence or absence of a process error in each step, and generating a signal indicating a degree of error in the input data from the error location and the error magnitude.

DETAILED DESCRIPTION OF THE PREFERRED EMBODIMENTS

Embodiment 1

Hereinafter, a Reed-Solomon decoding apparatus according to a first embodiment of the present invention will be described with reference to the drawings.

Figure 1:
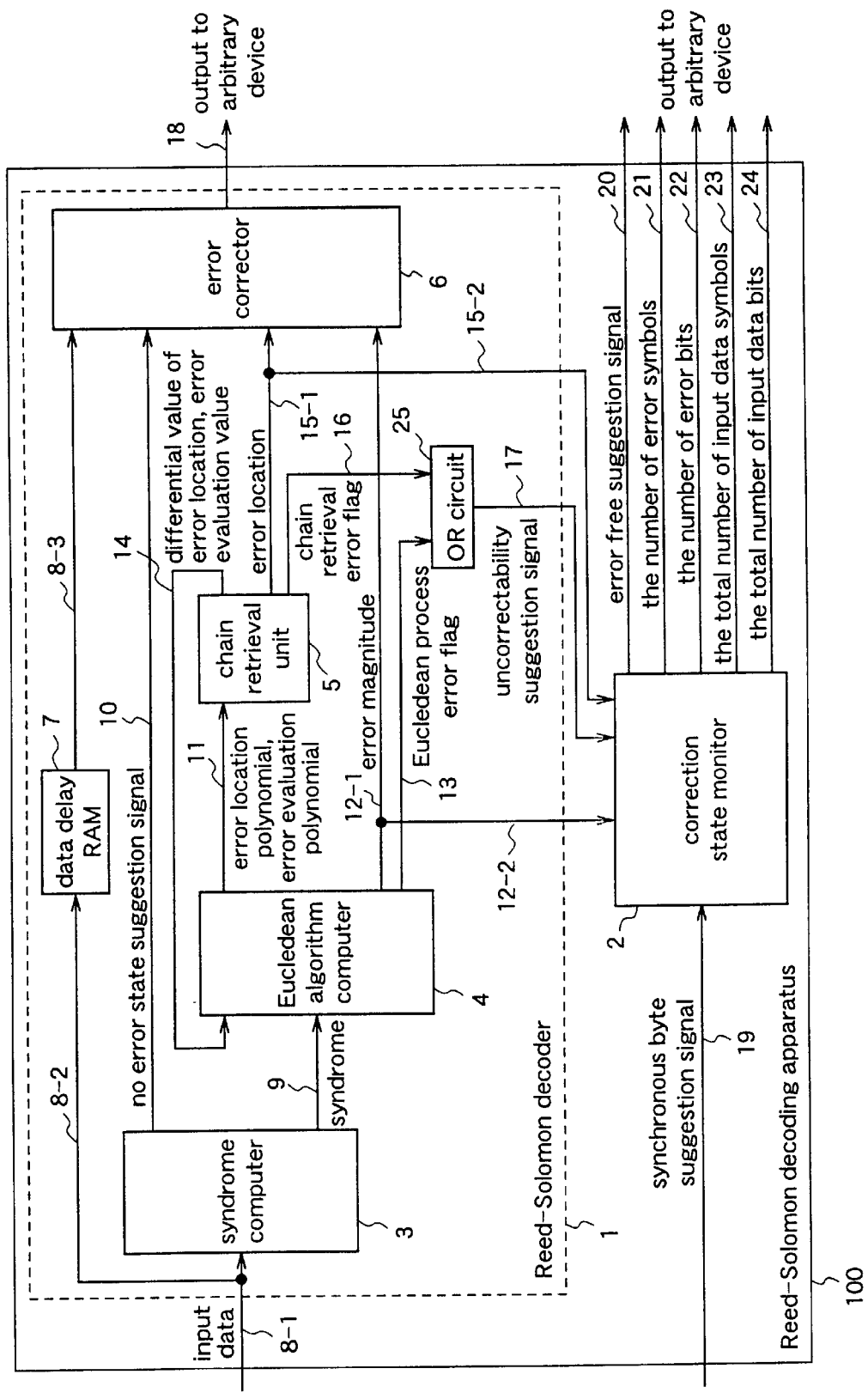
FIG. 1 is a block diagram illustrating a structure of a Reed-Solomon decoding apparatus 100 according to a first embodiment of the present invention.

FIG. 1 is a block diagram illustrating a structure of a Reed-Solomon decoding apparatus 100 according to this embodiment.

The Reed-Solomon decoding apparatus 100 according to the first embodiment comprises a Reed-Solomon decoder 1 for performing error correction for input data, and a correction state monitor 2 for detecting a process error in the error correction by the Reed-Solomon decoder 1 and monitoring a degree of errors in the input data.

The Reed-Solomon decoder 1 further comprises a syndrome computer 3 for computing a syndrome of the input data, a Eucledean algorithm computer 4 for computing an error location polynomial and an error evaluation polynomial from the syndrome, and further computing a magnitude of an error on the basis of a result from a chain retrieval unit 5, the chain retrieval unit 5 for computing an error location, a differential value of the error location, and an error evaluation value from the error location polynomial and the error evaluation polynomial, an error corrector 6 for correcting data indicated by the error location data on the basis of the error location and the magnitude of the error, a data delay RAM 7 for holding the input data for a predetermined time, and an OR circuit 25 for implementing OR operation for error flags indicating errors output from the Eucledean algorithm computer 4 and the chain retrieval unit 5 and outputting the result.

In the first embodiment, the chain retrieval unit 5 has a function as an error location computer for computing the error location indicating an error byte in the input data. The Eucledean algorithm computer 4 has a function as an error magnitude computer for computing an error magnitude indicating which bits are erroneous among bits constituting the error byte indicated by the error location. Here, the function as the error magnitude computer can be carried out by the chain retrieval unit in place of the Eucledean algorithm computer.

The correction state monitor 2 generates a signal indicating the presence or absence of a process error in the Eucledean algorithm computer 4 and the chain retrieval unit 5, i.e., an error free suggestion signal, and a signal indicating a degree of errors in the input data.

Hereinafter, operations of the respective elements will be described in accordance with procedures of the error correction process.

Input data transmitted through a transmission path 8-1 is input to the syndrome computer 3 in the Reed-Solomon decoder 1, and also captured by the data delay RAM 7 via a signal line 8-2 and held in the data delay RAM 7 for an appropriate time. The syndrome computer 3 computes a syndrome from the input data and transmits the computed syndrome to the Eucledean algorithm computer 4 via a signal line 9. The syndrome computer 3 also judges the presence or absence of an error in the input data and when it judges that no error exists, transmits a no error state suggestion signal, which is made active, to the error corrector 6 via a signal line 10.

The Eucledean algorithm computer 4 computes an error location polynomial and an error evaluation polynomial from the syndrome and transmits the computed error location polynomial and error evaluation polynomial to the chain retrieval unit 5 via a signal line 11. In addition, when the Eucledean algorithm computer 4 detects a process error during the computation of the error location polynomial and the error evaluation polynomial, it outputs a Eucledean process error flag, which is made active, to the OR circuit 25 via a signal line 13.

The chain retrieval unit 5 computes an error location of the input data from data of the error location polynomial and the error evaluation polynomial received from the Eucledean algorithm computer 4, and transmits the computed error location data to the error corrector 6 via a signal line 15-1 and to the correction state monitor 2 via a signal line 15-2, while computes a differential value of the error location and an error evaluation value and transmits the same to the Eucledean algorithm computer 4 via a signal line 14. When the chain retrieval unit 5 detects a process error during the computation of the above data, it outputs a chain retrieval error flag, which is made active, to the OR circuit 25 via a signal line 16.

After computing the above-described error location polynomial and error evaluation polynomial, the Eucledean algorithm computer 4, upon receipt of the differential value of the error location and the error evaluation value which are computed by the chain retrieval unit 5, computes an error magnitude, and outputs the computed error magnitude to the error corrector 6 via a signal line 12-1 and to the correction state monitor 2 via a signal line 12-2.

When the no error state suggestion signal transmitted from the syndrome computer 3 is not active, i.e., when an error exists in the input data, the error corrector 6 corrects the input data transmitted from the data delay RAM 7 via a signal line 8-3 into correct data on the basis of the error location detected by the chain retrieval unit 5 and the error magnitude computed by the Eucledean algorithm computer 3. The thus corrected data is output to an arbitrary device connect to the Reed-Solomon decoding apparatus 100, via a signal line 18.

The correction state monitor 2 performs the following process to output signals for judging whether the above-described series of correction processes are correctly performed or not.

Figure 2:
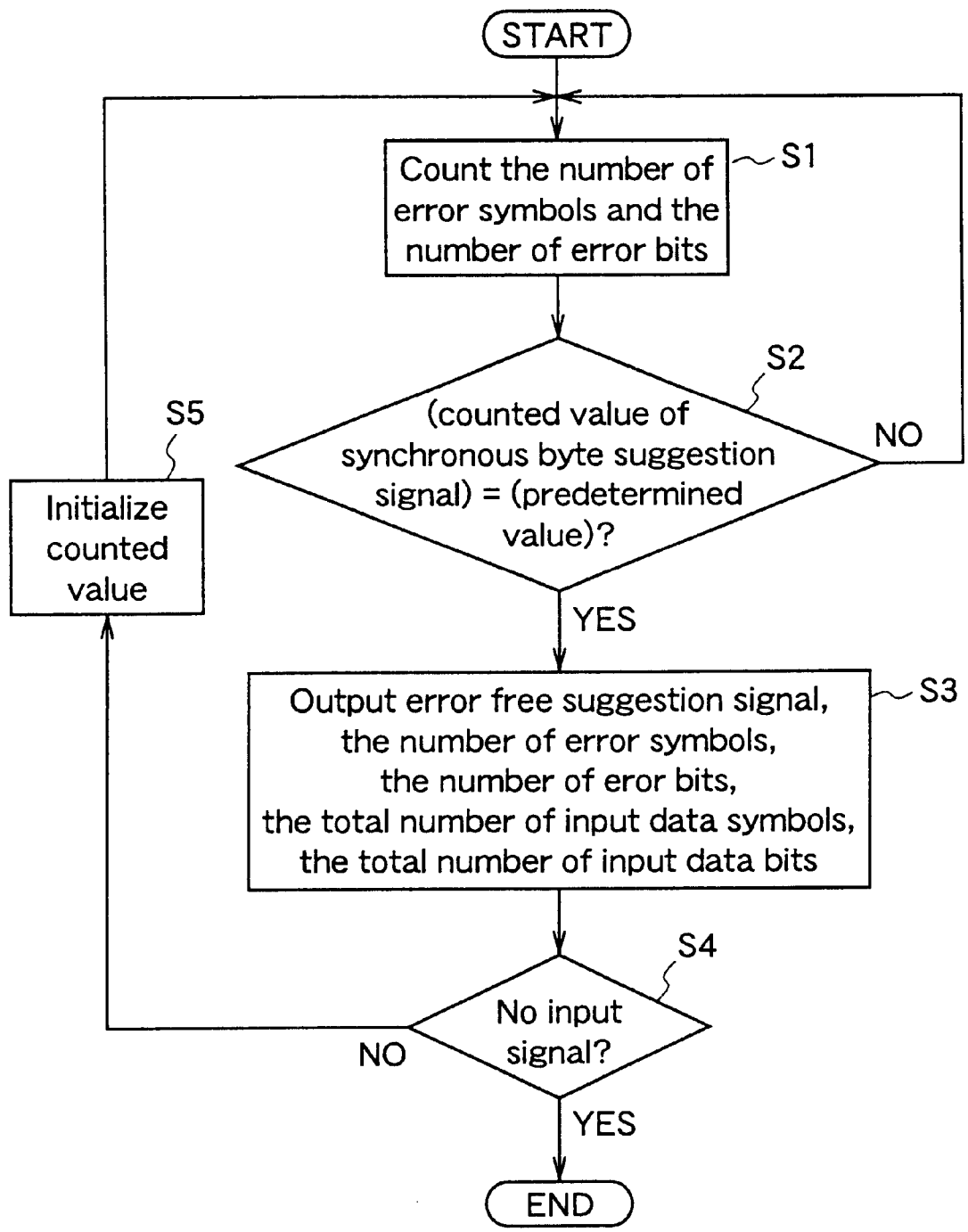
FIG. 2 is a flowchart for explaining an example of an operation of a correction state monitor 2.

FIG. 2 is a flowchart for explaining an operation of the correction state monitor 2.

Initially, the correction state monitor 2 counts the number of error symbols and the number of error bits, respectively (step S1).

Further, the correction state monitor 2 counts synchronous byte suggestion signals which are made active when synchronous signals of the input data are detected and when the counted value is a predetermined value (YES in Step S2), generates an error free suggestion signal and signals indicating a degree of the error in the input data (step S3). In this first embodiment, as signals indicating the degree of error in the input data, the number of error symbols, the number of error bits, the total number of input data symbols, and the total number of input data bits are output to an arbitrary device, it is then checked whether the input data remains or not (step S4) and when the data remains, the counted value is initialized (step S5), and then it goes back to step S1.

Step S1 will be described in more detail.

The correction state monitor 2 receives the error location data output from the chain retrieval unit 5, counts the number of error location data, and computes the number of error symbols.

For example, suppose that one packet of input data comprises n bytes. Since the computed error location data is data which indicates an estimated position (byte) of the error in the input data, that data is any number of to which indicated 1st to n-th positions, respectively. Each of error bytes in a packet has the error location data. Therefore, by counting the number of the error location data, the number of error bytes in a packet, i.e., the number of error symbols, can be obtained. The obtained number of error symbols is output to an arbitrary device connected to the Reed-Solomon decoding apparatus 100 via a signal line 21.

In addition, the correction state monitor 2 receives the error magnitude data output form the Eucledean algorithm computer 4 and computes the number of error bits. The error magnitude data is data which identifies an error bit in the byte of the position indicated by the error location data. Supposing that one byte, i.e., one symbol comprises 8-bit data, the error magnitude data is also 8-bit data, and each of 1st to 8th bits in one byte of the error magnitude data corresponds to each of 1st to 8th bits in one symbol of the input data. A bit in the error magnitude data is when no error exists in the corresponding bit in the input data, and when an error exists. For example, supposing that the error location data is 3 in the decimal number and the error magnitude data is 5 in the hexadecimal number, the 33rd symbol has errors and 4 bits, i.e., the 1st, 3rd, 5th, and 7th bits from the right are erroneous in 8-bit data constituting the 33rd symbol (that is, the error magnitude data is represented as 1010101 in the binary number). Therefore, in the above-described example, by counting the number of in the error magnitude data, the number of the error bits can be obtained. The obtained number of error bits is output to an arbitrary device connected to the Reed-Solomon decoding apparatus 100 via a signal line 22.

The correction state monitor 2 counts the number of error symbols and the number of error bits and outputs the obtained result, as described above, while it receives the synchronous byte suggestion signals which are made active when the synchronous signals in the input data are detected, through a signal line 19 and counts the synchronous byte suggestion signals. The synchronous signal is padded at the head of each of packets constituting the input data. Before the input data is input to the Reed-Solomon decoding apparatus 100, a synchronous circuit (not shown) detects the synchronous signal as well as outputs the synchronous byte suggestion signal, which is made active, to the correction state monitor 2.

Step S2 will be described in more detail.

The correction state monitor 2 may collectively monitor all of the series of data which is input to the Reed-Solomon decoding apparatus 100. However, it usually monitors the series of input data for each predetermined amount of data, i.e., by dividing the input data into a predetermined number of packets. Especially in a case where the series of input data have a large amount, when errors in the input data are more than the correction capability, LSI can perform processing for each predetermined number of packets more efficiently than for all the input data. Therefore, the correction state monitor 2 presets the number of packets which are to be collectively monitored, i.e., the number of synchronous byte suggestion signals to be counted, counts the synchronous byte suggestion signals up the preset value, and thereafter proceeds to step S3.

Step S3 will be described in more detail.

Since the number of bytes and the number of bits in one packet are fixed, the number of packets is known by counting the synchronous byte suggestion signals, and thereby the number of bytes and the number of bits in the input data can be obtained. Therefore, when the correction state monitor 2 counts the set number of the synchronous byte suggestion signals, it computes the number of bytes (symbols) and the number of bits of data included in the counted number of packets, i.e., the total number of input data symbols and eh total number of input data bits which are input to the Reed-Solomon decoding apparatus 100, and outputs the same to an arbitrary device through signal lines 23 and 24.

On the other hand, when the Reed-Solomon decoder 1 does not perform the correction process normally, an error flag indicating that the process is not performed normally, such as a Eucledean process error flag output from the Eucledean algorithm computer 4 or a chain retrieval error flag output from the chain retrieval unit 5, is made active, and the active flag is transmitted to the OR circuit 25. The OR circuit 25 ORs the input error flags, makes a uncorrectability suggestion signal active, and transmits the active uncorrectability suggestion signal to the correction state monitor 2 via a signal line 17. When the uncorrectability suggestion signal is active, the correction state monitor 2 outputs the error free suggestion signal without being made active to indicate that the error correction process is not performed correctly in the Reed-Solomon decoder 1. On the other hand, when the uncorrectability suggestion signal is not active, the correction state monitor 2 outputs the error free suggestion signal which is made active to an arbitrary device connected to the Reed-Solomon decoding apparatus 100, via a signal line 20, to indicate that the error correction process is performed correctly in the Reed-Solomon decoder 1.

As described above, the correction state monitor 2 computes the total number of input bytes (symbols) and the total number of input bits, and the number of error symbols and the number of error bits which are corrected by the Reed-Solomon decoder 1 for each data of the preset number of packets, and outputs the same to an arbitrary device. Further, the correction state monitor 2 checks the uncorrectability suggestion signal to confirm whether the correction process is performed correctly in the Reed-Solomon decoder 1, and when the correction process is normal, outputs the error free suggestion signal. Therefore, and indication of whether the total number of input data symbols and bits, and the numbers of error symbols and bits, which are computed by the correction state monitor 2 are effective data computed when the Reed-Solomon decoder 1 correctly performs the correction process, or invalid data computed in case of the uncorrectability, is shown by the error free suggestion signal.

Next, a detailed structure of the correction state monitor 2 will be described.

Figure 3:
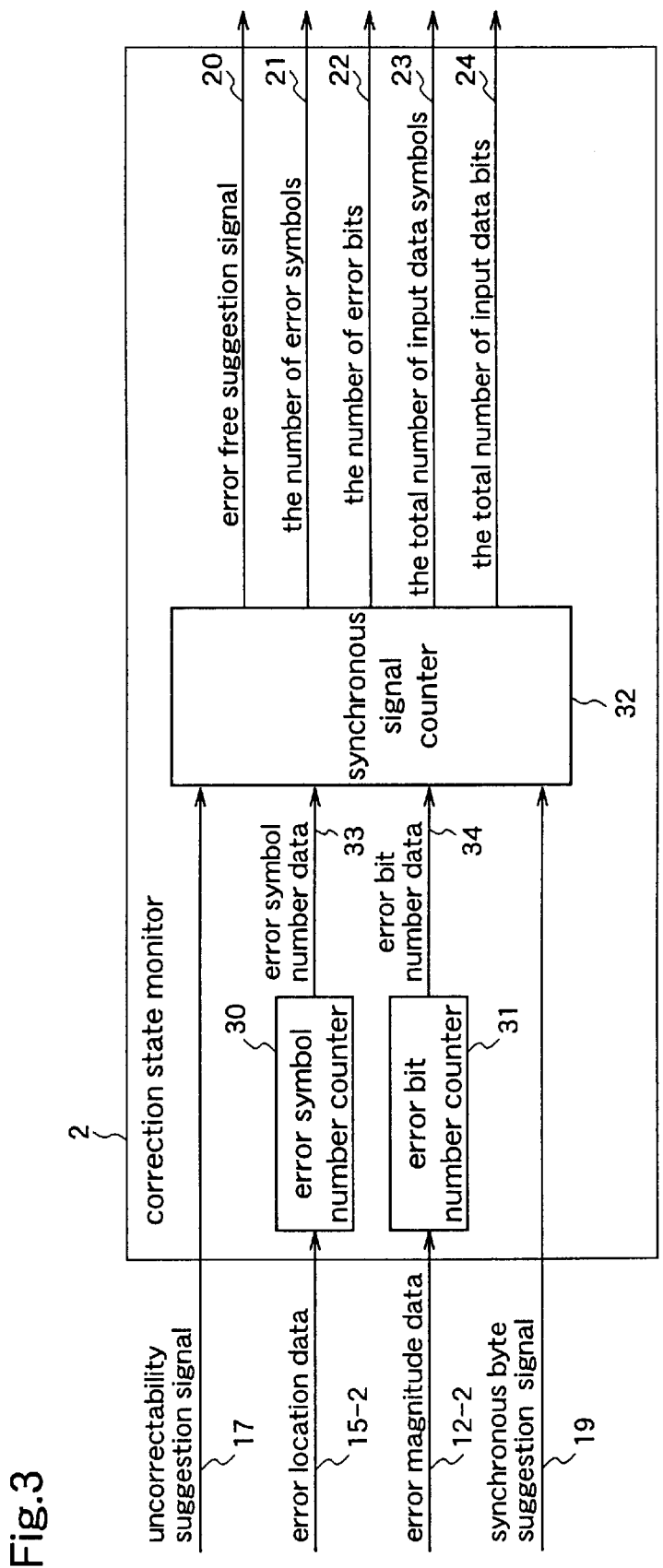
FIG. 3 is a block diagram illustrating structure of the correction state monitor 2.

FIG. 3 is a block diagram illustrating a structure of the correction state monitor 2. The correction state monitor 2 comprises an error symbol number counter 30, an error bit number counter 31, and a synchronous signal counter 32.

In order to obtain the number of error symbols, the error symbol number counter 30 counts the number of error location data detected by the chain retrieval unit 5, i.e., the number of error symbols, and outputs the counted number of error symbols to the synchronous signal counter 32 via a signal line 33.

As described above, when the input data has a code length of n, one packet comprises n bytes and the error location data is a number indicating a position of a byte including errors, i.e., any number of "1" to "n" which indicate the 1st to n-th positions, respectively. The error symbol number counter 30 counts the number of error location data to obtain the number of error bytes, i.e., the number of error symbols.

In order to obtain the number of error bits, the error bit number counter 31 receives data indicating the error magnitude which is computed by the Eucledean algorithm computer 4, counts the number of bits which are represented by "1" in the error magnitude data, and outputs the number of error bits to the synchronous signal counter 32 via a signal line 34.

As previously stated, supposing that one byte, i.e., one symbol of input data comprises 8-bit data, the error magnitude data is 8-bit data. The 1st to 8th bits in one byte of the error magnitude data are "0" when no error exists in corresponding bits in the input data, respectively, and "1" when an error exists. Therefore, the number of error bits can be obtained by counting the number of "1" in the error magnitude data.

The synchronous signal counter 32 has broadly three functions.

As the first function, the synchronous signal counter 32 counts the synchronous byte suggestion signals and obtains the number of bytes and the number of bits of input data, as described above.

As the second function, when the uncorrectability suggestion signal output from the Reed-Solomon decoder 1 is active, the synchronous signal counter 32 outputs the error free suggestion signal without being made active to indicate the uncorrectability by the Reed-Solomon decoder 1, as described above. On the other hand, when the uncorrectability suggestion signal is not active, the synchronous signal counter 32 outputs the error free suggestion signal which is made active.

As the third function, the synchronous signal counter 32 counts the set value of the synchronous byte suggestion signals, thereafter receives the number of error symbols output from the error symbol number counter 30 and the number of error bits output from the error bit counter 31, and outputs the same. In addition, in synchronization with the output of the number of error symbols and the output of the number of error bits, the synchronous signal counter 32 switches the error free suggestion signal to be active or inactive on the basis of the uncorrectability suggestion signal, and outputs the error free suggestion signal through the signal line 20.

The total numbers of input data symbols and bits are output in synchronization with the output of the number of the error symbols and the number of error bits. Here, since the number of packets of data which is collectively monitored by the correction state monitor 2 is preset, the total numbers of input data symbols and bits are fixed unless the number of packets to be collectively monitored is changed. Therefore, when the total numbers of input data symbols and bits are also computed previously in the synchronous signal counter 32, there is no necessity of computing the total input numbers each time the set number of synchronous byte suggestion signals is counted.

The error free suggestion signal, the number of error symbols, the number of error bits, the total number of input data symbols, and the total number of input data bits which are output from the synchronous signal counter 32 are indices for judging whether the Reed-Solomon decoder 1 effectively functions. Therefore, by utilizing the above-described signals, the precision in the error correction can be increased.

For example, if the Reed-Solomon decoder 100 can correct again errors in the data in a case where the error free suggestion signal is inactive, errors in the input data can be removed or decreased. In addition, if a symbol error rate is obtained by an arbitrary device by dividing the number of error symbols by the total number of input data symbols, and a bit error rate is obtained by dividing the number of error bits by the total number of input data bits, error frequency of the input data is known. Further, if data having the prominent computed symbol error rate and bit error rate can be corrected again by the Reed-Solomon decoding apparatus 100, errors in the input data can be removed or decreased.

In this first embodiment, the number of error symbols, the number of error bits, the total number of input data symbols, and the total number of input data bits are output from the correcting state monitor 2. However, it is sufficient that at least the number of error bits and the total number of input data bits are output by a system including the Reed-Solomon decoding apparatus 100 of the first embodiment.

As described above, according to the first embodiment, occurrence of process errors in the Reed-Solomon decoding process and the number of error-corrected bits and symbols in the input data are always monitored during the Reed-Solomon decoding process, and signals as indices for judging whether the Reed-Solomon decoder effectively functions can be output. Therefore, when the error correction state is improper, such as when the error correction cannot be performed, or when the error occurrence frequency in the input data is high, LSI including the Reed-Solomon decoding apparatus 100 can deal with the case and increase the precision in the error correction, on the basis of the indices output from the Reed-Solomon decoding apparatus 100. For example, on the basis of various signals output from the correction state monitor 2, LSI can judge whether the error correction is to be performed again.

Embodiment 2

Figure 4:
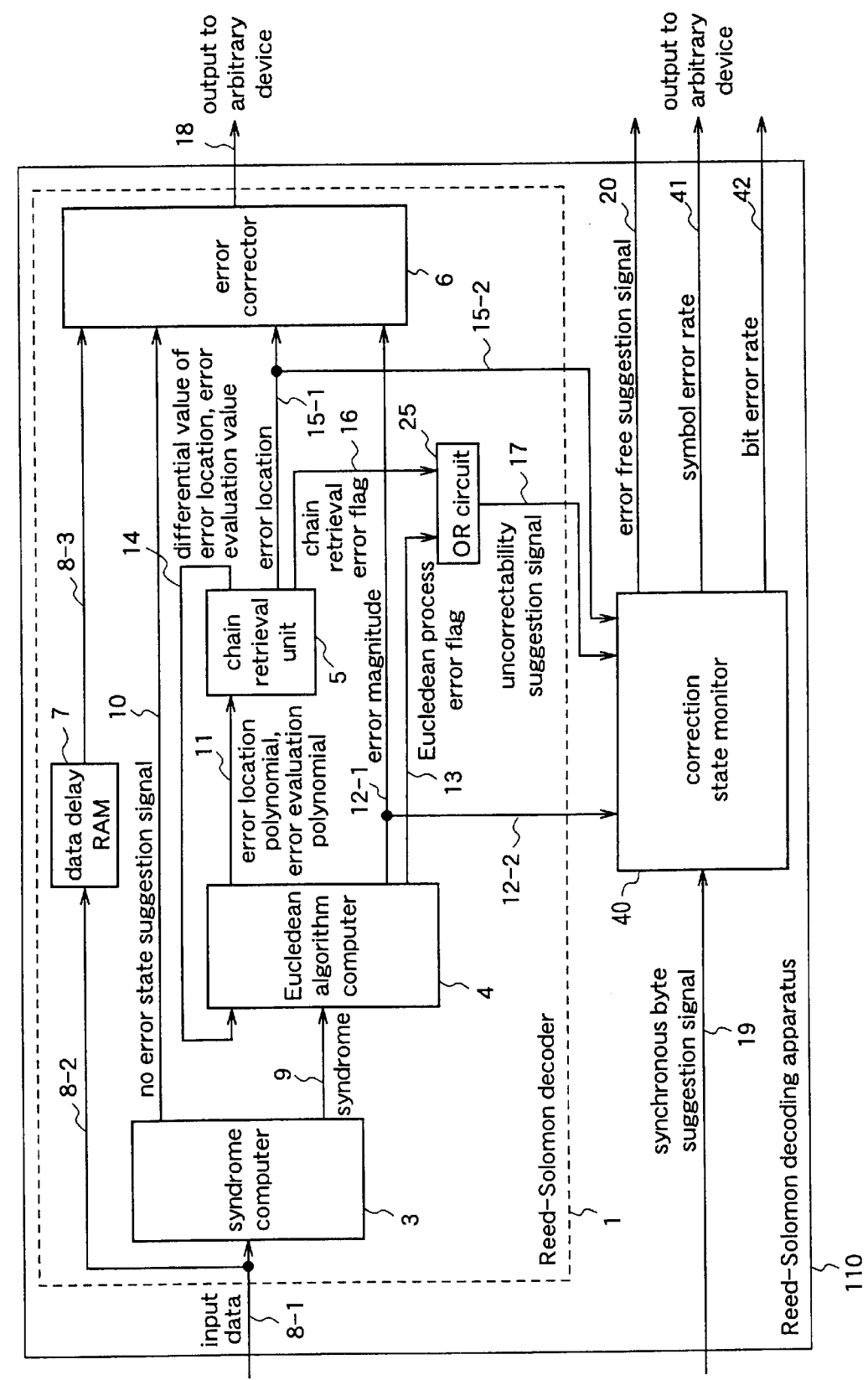
FIG. 4 is a block diagram illustrating a structure of a Reed-Solomon decoding apparatus 110 according to a second embodiment of the present invention.

FIG. 4 is a block diagram illustrating a structure of a Reed-Solomon decoding apparatus 110 according to a second embodiment. The same reference numerals as those in FIG. 1 designate the same or corresponding parts.

The Reed-Solomon decoding apparatus 110 comprises a Reed-Solomon decoder 1 and a correction state monitor 40. A structure and an operation of the Reed-Solomon decoder 1 are the same as those in the first embodiment.

The correction state monitor 40 outputs a symbol error rate through a signal line 41 and a bit error rate through a signal line 42, in place of the number of error symbols, the number of error bits, the total number of input data symbols, and the total number of input data bits, which are output from the correction state monitor 2 in the first embodiment.

Figure 5:
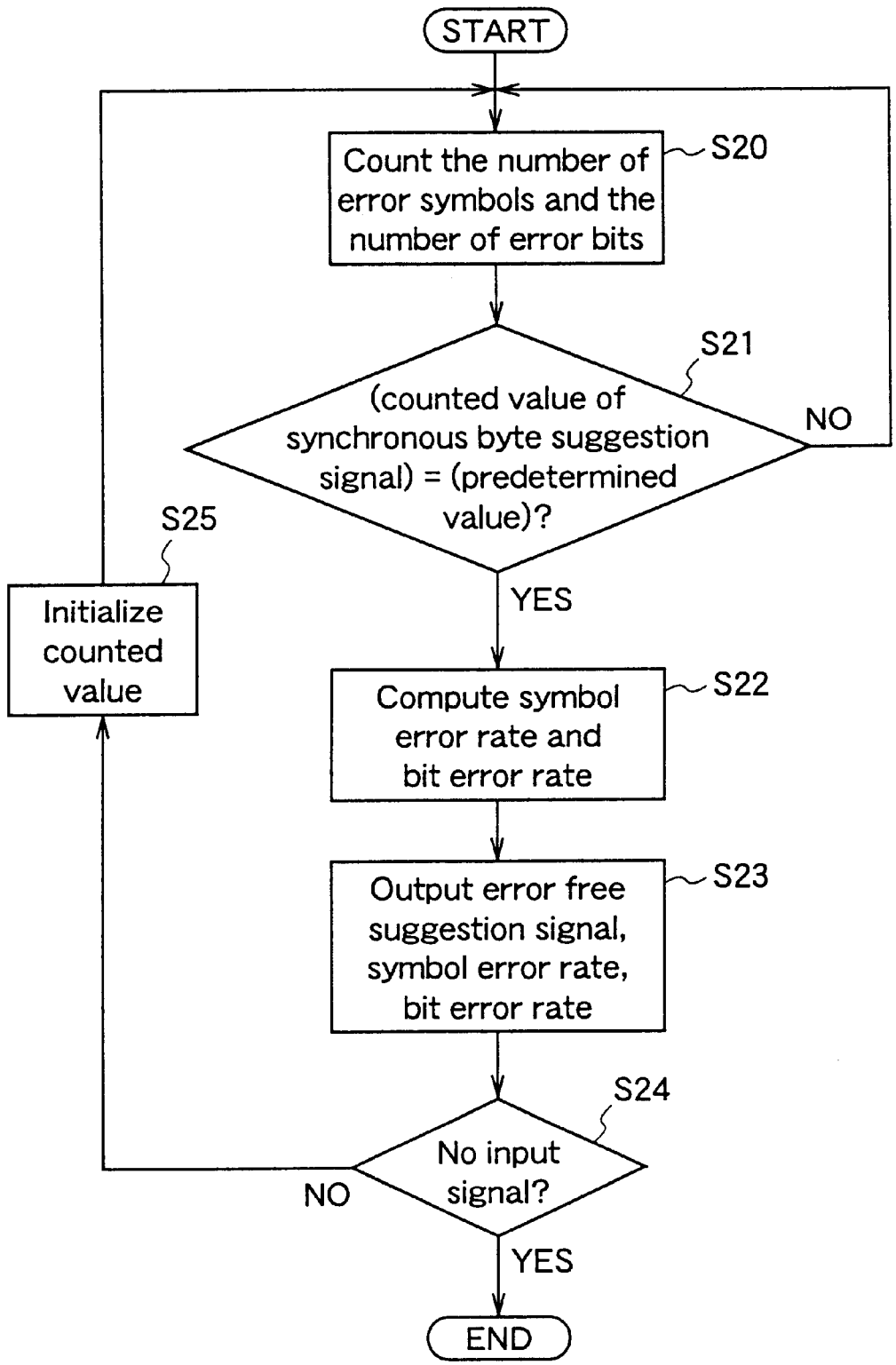
FIG. 5 is a flowchart for explaining an example of an operation of a correction state monitor 40.

FIG. 5 is a flowchart for explaining an operation of the correction state monitor 40.

Initially, the correction state monitor 40 counts the number of error symbols and the number of error bits, respectively (step S20).

Further, the correction state monitor 40 counts synchronous byte suggestion signals which are made active when synchronous signals in the input data are detected, and when the counted value is a predetermined value (YES in step S21), computes the symbol error rate and the bit error rate (step S22).

Then, the correction state monitor 40 outputs an error free suggestion signal, and the symbol error rate and the bit error rate as signals indicating a degree of errors in the input data, to an arbitrary device (step S23). Then, the correction state monitor 40 checks whether the input data remains or not (step S24), and when the data remains, the counted value is initialized (step S25), and then it goes back to step S20.

Figure 6:
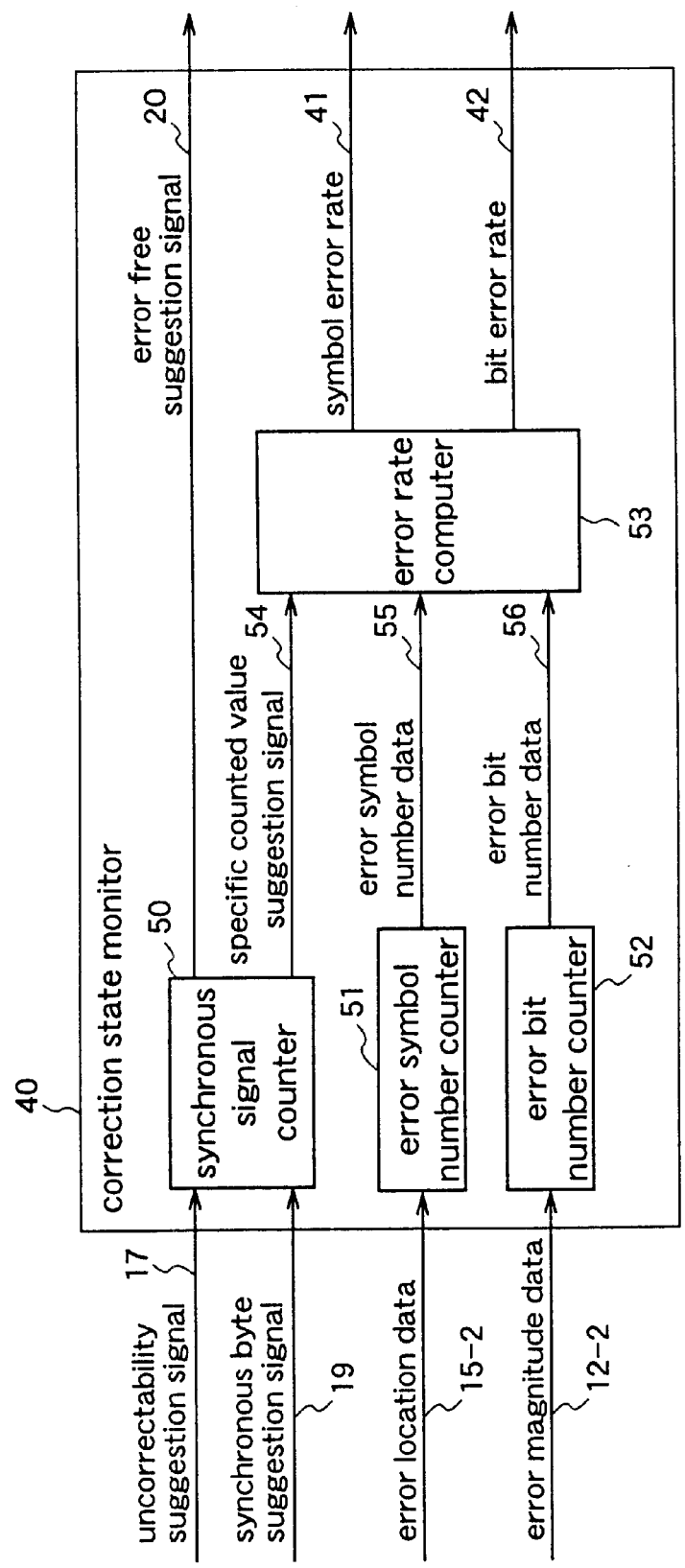
FIG. 6 is a block diagram illustrating a structure of the correction state monitor 40.

FIG. 6 is a block diagram illustrating a structure of the correction state monitor 40. The correction state monitor 40 comprises a synchronous signal counter 50, an error symbol number counter 51, an error bit number counter 52, and an error rate computer 53. Here, the error rate computer 53 has a function of computing the symbol error rate as a symbol error rate computer and a function of computing the bit error rate as a bit error rate computer.

The error symbol number counter 51 receives the error location data, computes the number of error symbols like the error symbol number counter 30 in the first embodiment, and outputs the number of error symbols to the error rate computer 53 via a signal line 55.

The error bit number counter 52 receives the error magnitude data, computes the number of error bits like the error bit number counter 31 in the first embodiment, and outputs the number of error bits to the error rate computer 53 via a signal line 56.

The synchronous signal counter 50 receives a uncorrectability suggestion signal and outputs an error free suggestion signal like the synchronous signal counter 32 in the first embodiment, but does not receive the number of error symbols and the number of error bits. In addition, when the synchronous signal counter 50 counts a specific number of synchronous byte suggestion signals, it outputs a specific counted value suggestion signal which is made active to the error rate computer 53 via a signal line 54. The specific counted value suggestion signal is a signal for indicating a packet interval when the correction state monitor 40 monitors the error correction state of the Reed-Solomon decoder 1 for each specific number of packets. For example, the specific counted value suggestion signal is output each time the maximum count value of the synchronous signal counter 50 is counted. As described above, the synchronous signal counter 50 outputs the specific counted value suggestion signal, and the error free suggestion signal indicating the correction state.

The error rate computer 53 receives the number of error symbols computed by the error symbol number counter 51, the number of error bits computed by the error bit number counter 52, and the specific counted value suggestion signal output from the synchronous signal counter 50, computes the symbol error rate and the bit error rate, and outputs the same.

As described above, the interval between times when the synchronous signal counter 50 outputs the active specific counted value suggestion signals is previously set. For example, assume that the specific counted value suggestion signal is made active each time the maximum count value of the synchronous signal counter 50 is counted. The total numbers of input data symbols and bits, which are input to the Reed-Solomon decoder 1 from when an active specific counted value suggestion signal is output until then next active suggestion signal is output, have constant values corresponding to the maximum count value of the synchronous signal counter 50. That is, by setting the output interval of the active specific counted value suggestion signals, the number of symbols and the number of bits of data which is input between the two outputs of the specific counted value suggestion signals are obtained. In the following description, assume that the specific counted value suggestion signal is output each time the maximum count value of the synchronous signal counter 50 is counted.

The error rate computer 53, in synchronization with a timing when the synchronous signal counter 50 makes the specific counted value suggestion signal active, computes a ratio of the number of error symbols and the number of error bits to the total number of input data symbols and the total number of input data bits, and outputs the symbol error rate and the bit error rate via the signal lines 41 and 42, respectively.

Figure 7:
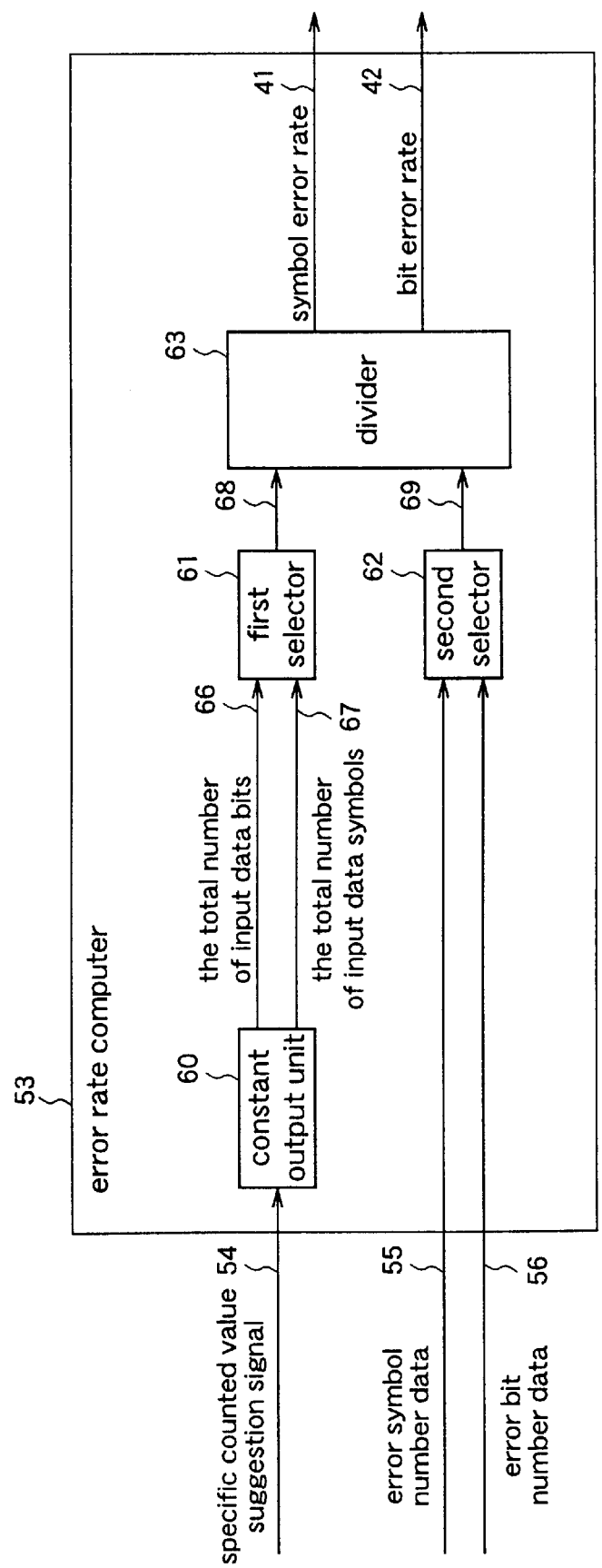
FIG. 7 is a block diagram illustrating a structure of an error rate computer 53.

FIG. 7 is a block diagram illustrating a structure of the error rate computer 53.

The error rate computer 53 comprises a constant output unit 60, a first selector 61, a second selector 62, and a divider 63.

The total numbers of input data symbols and bits corresponding to the maximum count value are previously computed in the constant output unit 60, or input thereto. When the constant output unit 60 receives the specific counted value suggestion signal, it outputs the previously computed or input total number of input data bits through a signal line 66, and the total number of input data symbols through a signal line 67, respectively, to the first selector 61.

As previously stated, since the interval between times when the synchronous signal counter 50 outputs the active specific counted value suggestion signal is set in advance, the total number of symbols and the total number of bits of the data which is input to the Reed-Solomon decoder 1 between an output and the next output of the specific counted value suggestion signals can be obtained in advance. For example, when the specific counted value suggestion signal is output each time the maximum count value of the synchronous signal counter 50 is counted, the obtained total numbers of input data symbols and bits have constant values corresponding to the maximum count value of the synchronous signal counter 50.

The first selector 61 receives the total number of input data bits and the total number of input data symbols obtained by the constant output unit 61, selects either of the two, and outputs the selected one as selected data to the divider 63.

The second selector 62 receives the number of error symbols and the number of error bits, selects either of the two, and outputs the selected one as selected data to the divider 63.

The first selector 61 and the second selector 62 are controlled by a control unit (not shown) which controls inside of the error rate computer 53 such that the first selector 61 selects the total number of input data symbols and the second selector 62 selects the number of error symbols, or the first selector 61 selects the total number of input data bits and the second selector 62 selects the number of error bits.

When the divider 63 receives the total number of input data symbols as the selected data of the first selector and the number of error symbols as the selected data of the second selector, it computes the symbol error rate by dividing the number of error symbols by the total number of input data symbols, and outputs the obtained symbol error rate via the signal line 42. In addition, when the divider 63 receives the total number of input data bits as the selected data of the first selector and the number of error bits as the selected data of the second selector, it computes the bit error rate by dividing the number of error bits by the total number of input data bits, and outputs the bit error rate via the signal line 42.

Figure 8:
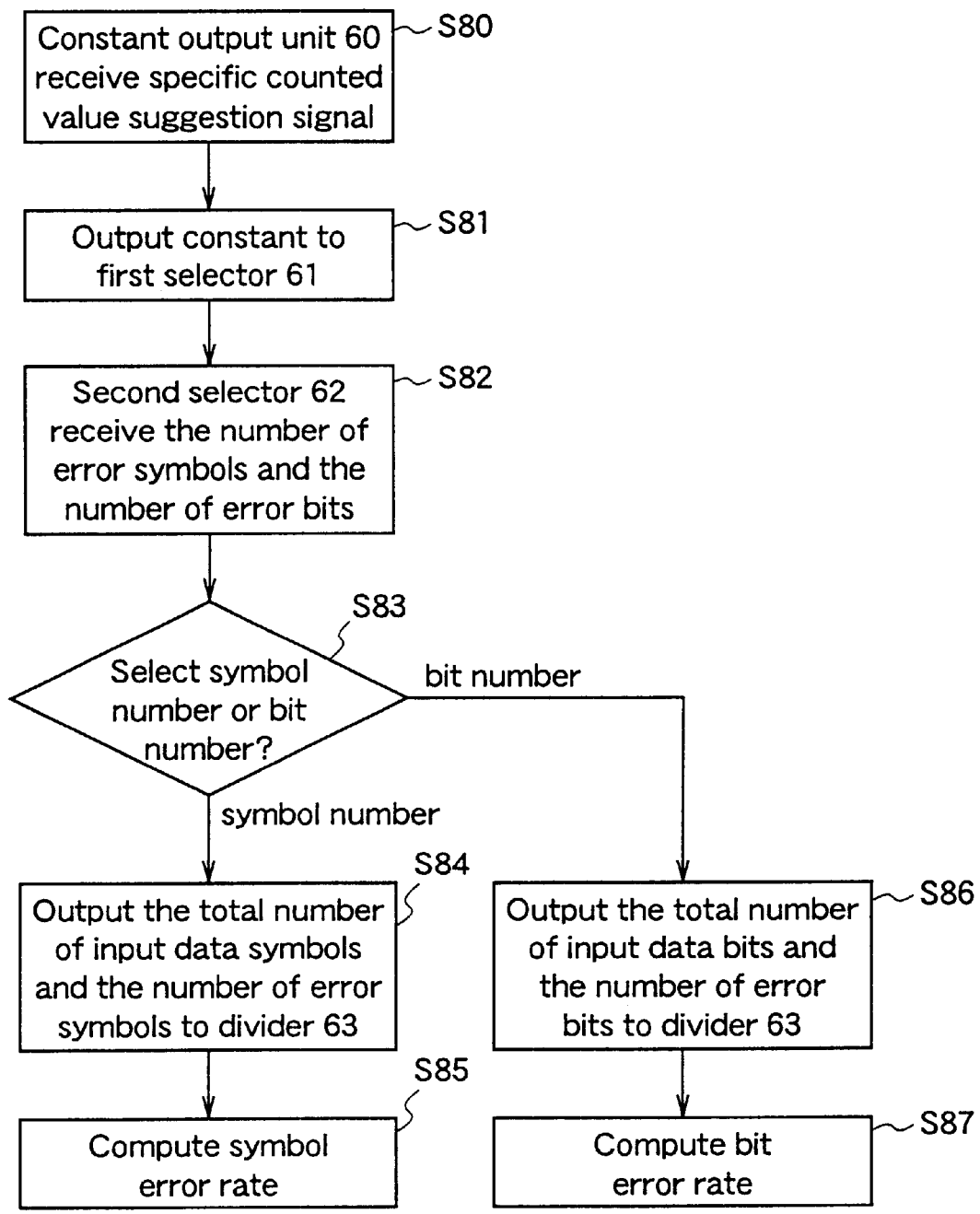
FIG. 8 is a flowchart for explaining an example of an operation of the error rate computer 53.

FIG. 8 is a flowchart for explaining an operation of the error rate computer 53.

When the constant output unit 60 receives the specific counted value suggestion signal (step S80), it outputs the previously obtained total number of input data bit and total number of input data symbols to the first selector 61 (step S81).

The second selector 62 receives the error symbol number data and the error bit number data (step S82).

When the control unit of the error rate computer 53 instructs the first and second selectors 61 and 62 to select the symbol numbers (step S83), the first selector 61 outputs the total number of input data symbols to the divider 63, the second selector 62 outputs the number of error symbols to the divider 63 (step S84), and then the divider 63, computes the symbol error rate (step S85).

On the other hand, when the control unit of the error rate computer 53 instructs the first and second selectors 61 and 62 to select the bit number (step S83), the first selector 61 outputs the total number of input data bits to the divider 63, the second selector 62 outputs the number of error bits to the divider 63 (step S86), and then the divider 63 computes the bit error rate (step S87).

Here, the position of step S82 is not limited to that shown in FIG. 8, as long as step S82 is before step S83.

Figure 9:
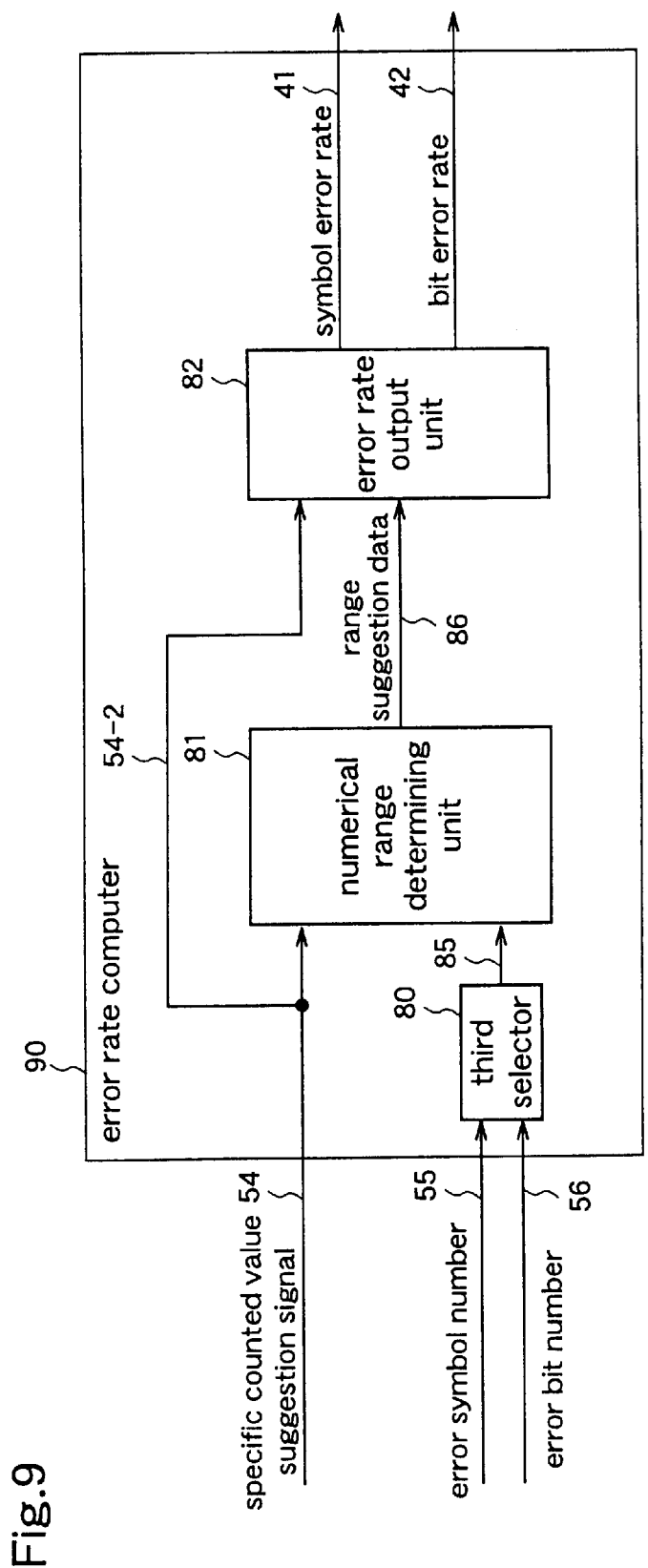
FIG. 9 is a block diagram illustrating a structure of an error rate computer 90.

Next, an error rate computer having another structure will be described. FIG. 9 is a block diagram illustrating a structure of an error rate computer 90. Here, the error rate computer 90 is provided in the correction state monitor 40 in place of the error rate computer 53 shown in FIG. 6. Therefore, a block diagram illustrating the correction state monitor 40 including the error rate computer 90 is omitted.

The error rate computer 90 comprises a third selector 80, a numerical range determining unit 81, and an error rate output unit 82.

The third selector 80 receives the number of error symbols through the signal line 55 and the number of error bits through the signal line 56, selects either of the two in accordance of a signal from a control unit (not shown) which controls inside the error rate computer 90, and outputs the selected one as selected data to the numerical range determining unit 81.

The numerical range determining unit 81 receives the data of the number of error symbols or the number of error bits as the selected data, receives the specific counted value suggestion signal through the signal line 54, then in synchronization with a timing when the specific counted value suggestion signal is made active, determines a range including the value of the selected data, and outputs the determined range, i.e., range suggestion data, to the error rate output unit 82 via a signal line 86.

Plural assumable ranges of the selected data are previously input to the numerical range determining unit 81. The numerical range determining unit 81 compares input selected data with each of the previously input ranges, and determines a numerical range including the input selected data. To each of the previously input ranges, a number is assigned and output as range suggestion data. When the numerical range determining unit 81 determines a range including the selected data, it outputs a number assigned to the determined range as the range suggestion data.

For example, assume that 99 ranges which are obtained by dividing 1,000 to 99,999 at intervals of 1,000 are input to the numerical range determining unit 81 as the ranges of the selected data, and 1, 2, 3, . . . , 99 are assigned to the respective ranges in increasing order of number as the range suggestion data. When the numerical range determining unit 81 recognizes that the selected data is within a range of 1,000–1,999, it outputs "1" which is previously assigned to the range of 1,000–1,999 as the range suggestion data, and when it recognizes that the selected data is within a range of 2,000–2,999, it outputs "2" as the range suggestion data.

The error rate output unit 82 receives the range suggestion data output from the numerical range determining unit 81 and the specific counted value suggestion signal transmitted through a signal line 54–2, and in synchronization with a timing when the specific counted value suggestion signal is made active, outputs the error rates.

As previously stated, since the interval between times when the synchronous signal counter 50 outputs the active specific counted value suggestion signal is set in advance, the total number of symbols and the total number of bits of the data which is input to the Reed-Solomon decoder 1 between an output and the next output of the specific counted value suggestion signals are constant. For example, when the specific counted value suggestion signal is output each time the maximum count value of the synchronous signal counter 50 is counted, the obtained total numbers of input data symbols and bits have constant values corresponding to the maximum count value of the synchronous signal counter 50. Therefore, the total numbers of input data symbols and bits are previously computed by the error rate output unit 82.

The error rate output unit 82 previously selects a numeric value included in the range indicated by the range suggestion data as an approximate value, and treats the selected approximate value as the value of the number of error symbols or the number of error bits. Explaining with using the above example, in a case where the error rate output unit 82 sets an intermediate value of the range as the approximate value, when the range suggestion data is "1", the number of error symbols to the number of error bits is uniformly the intermediate value "1,500".

As described above, the total numbers of input data symbols and bits have constant values. In addition, an approximate value is set to each range suggestion data for the numbers of error symbols and bits, and thereby values of the number of error symbols and bits are limited. Therefore, error rates for the respective approximate values of the numbers of error symbols and bits are computed, and the previously computed error rate is selected and output according to the range suggestion data.

Figure 10:
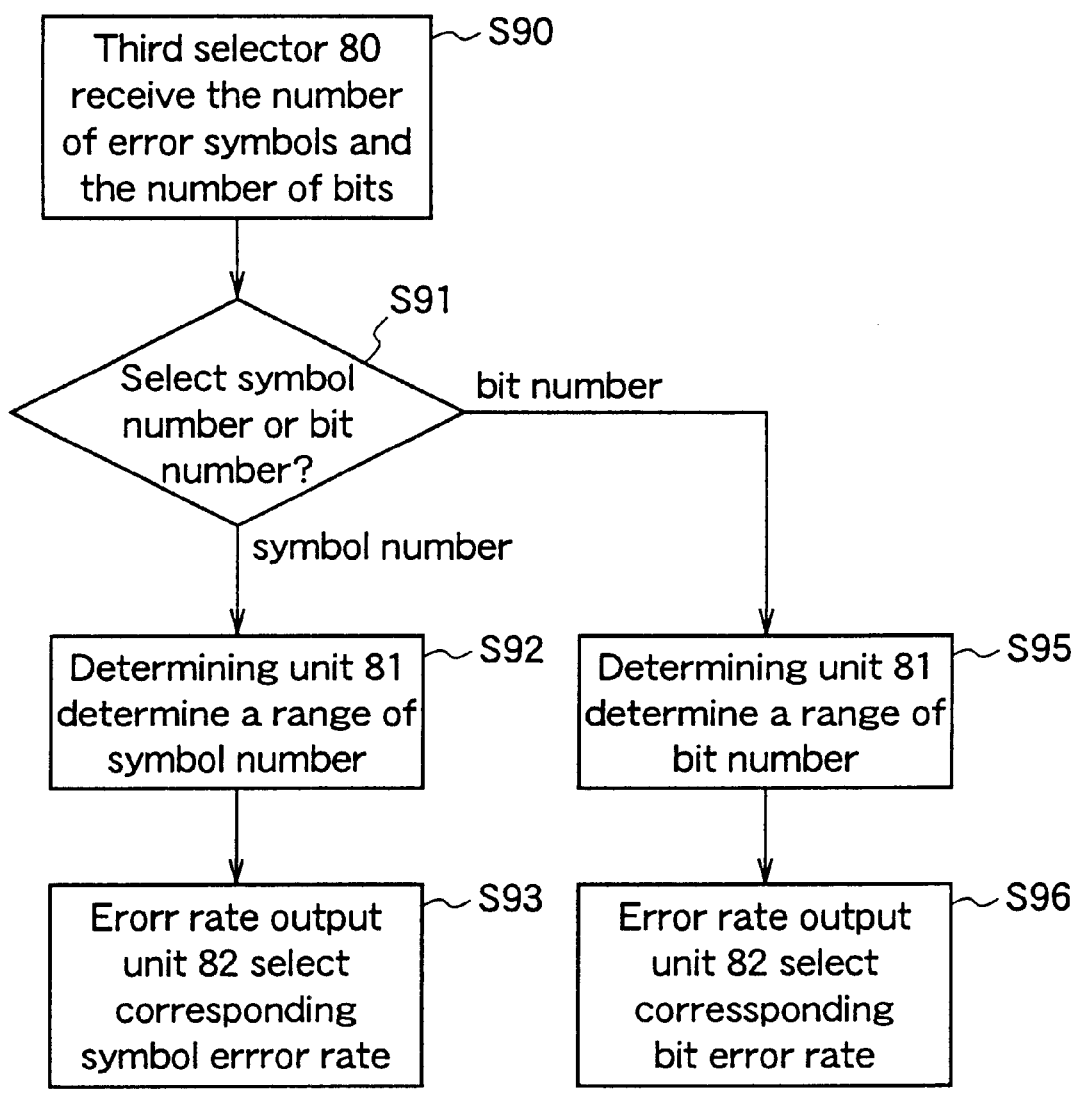
FIG. 10 is a flowchart for explaining an operation of the error rate computer 90.

FIG. 10 is a flowchart for explaining an operation of the error rate computer 90.

The third selector 80 receives the number of error symbols and the number of error bits (step S90), and selects the symbol numbers or the bit numbers in accordance with the instruction of the control unit which controls inside the error rate computer 90 (step S91).

When the symbol numbers are selected, the numerical range determining unit 81, in synchronization with a timing when the specific counted value suggestion signal is made active, determines a range including the value of the number of error symbols, and outputs the determined range, i.e., range suggestion data, to the error rate output unit 82 (step S92).

The error rate output unit 82, in synchronization with a timing when the specific counted value suggestion signal is made active, selects a symbol error rate corresponding to the range suggestion data which is actually output by the numerical range determining unit 81, among the symbol error rates previously computed for respective range suggestion data, and outputs the selected symbol error rate (step S93).

On the other hand, when the bit numbers are selected, the numerical range determining unit 81, in synchronization with a timing when the specific counted value suggestion signal is made active, determines a range including the value of the number of error bits, and outputs the determined range, i.e., range suggestion data, to the error rate output unit 82 (step S95).

The error rate output unit 82, in synchronization with a timing when the specific counted value suggestion signal is made active, selects a bit error rate corresponding to the range suggestion data which is actually output by the numerical range determining unit 81, among the previously computed bit error rate for respective range suggestion data, and outputs the selected bit error rate (step S96).

In this way, in the second embodiment, the symbol error rate and the bit error rate can be obtained within the correction state monitor 40.

In addition, by employing the error rate computer 90, an approximate value of the error rate can be output in accordance with the range suggestion data without performing the division at each reception of the range suggestion data. Therefore, this embodiment is suitable for a case where the computation of an accurate symbol error rate or bit error rate is not required or the simplification of the structure of the correction state monitor 40 is required.

In this second embodiment, the symbol error rate and the bit error rate are output from the correction state monitor 40. However, it is sufficient that at least one of the bit error rate and the symbol error rate is output by a system including the Reed-Solomon decoding apparatus 110 of the second embodiment. For example, when only one of the bit error rate and the symbol error rate is output, the first and second selectors 61 and 62 are deleted in the case of the correction state monitor 40 utilizing the error rate computer 53, and the third selector 80 is deleted in the case of the correction state monitor utilizing the error rate computer 90. Further, a structure which can always output the bit error rate and output the symbol error rate as required, can also be utilized.

Further, a program code of software stored in a computer-readable storage medium can realize part or all of the functions described in the first and second embodiments. Therefore, a storage medium containing a program code which can realize the functions of the above-described embodiments constitutes the present invention.

What is claimed is:

1. A Reed-Solomon decoding apparatus comprising:
    a Reed-Solomon decoder operable to perform error correction for input data with a Reed-Solomon code;
    a correction state monitor operable to detect a process error in the error correction by said Reed-Solomon decoder and monitor a degree of error in the input data;
    wherein said Reed-Solomon decoder comprises:
        a syndrome computer operable to compute a syndrome from the input data;
        an Eucledean algorithm computer operable to compute an error location polynomial and an error evaluation polynomial using the syndrome;
        an error location computer operable to compute an error location indicating an error byte in the input data from the error location polynomial and the error evaluation polynomial; and
        an error corrector operable to correct the input data by using the error location and an error magnitude indicating an error bit among bits constituting the error byte indicated by the error location, the error magnitude being computed by either of said Eucledean algorithm computer or said error location computer by using the error location polynomial and the error evaluation polynomial;
    wherein said correction state monitor is operable to monitor said Eucledean algorithm computer and said error location computer, generate a signal indicating the presence or absence of a process error in each of said Eucledean algorithm computer and said error location computer, and generate a signal indicating the degree of error in the input data from the error location and the error magnitude;
    wherein said correction state monitor comprises:
        an error symbol number counter operable to count the number of the error bytes indicated by the error location; and
        a symbol error rate computer operable to compute a symbol error rate from the total number of symbols in data which is input to said Reed-Solomon decoding apparatus and the number of the error symbols which are counted by said error symbol number counter while a predetermined number of synchronous byte suggestions signals which are output in synchronization with synchronous signals of the input data are counted;
    wherein the signal indicating the degree of error in the input data includes the symbol error rate; and
    wherein plural assumable ranges of the error symbol number are previously set, and said symbol error rate computer comprises:
        a determining unit operable to determine a range including the number of the error symbols which are counted by said error symbol number counter while the predetermined number of synchronous byte suggestion signals are counted in the set ranges; and
        an error rate output unit operable to previously compute symbol error rates from values, each of which is arbitrarily selected from each of the ranges set in said determining unit, and the total number of symbols in the input data, and output a symbol error rate corresponding to the range determined by said determining unit from the previously computed symbol error rates.

2. A Reed-Solomon decoding apparatus comprising:
    a Reed-Solomon decoder operable to perform error correction for input data with a Reed-Solomon code;
    a correction state monitor operable to detect a process error in the error correction by said Reed-Solomon decoder and monitor a degree of error in the input data;
    wherein said Reed-Solomon decoder comprises:
        a syndrome computer operable to compute a syndrome from the input data;
        an Eucledean algorithm computer operable to compute an error location polynomial and an error evaluation polynomial using the syndrome;
        an error location computer operable to compute an error location indicating an error byte in the input data from the error location polynomial and the error evaluation polynomial; and
        an error corrector operable to correct the input data by using the error location and an error magnitude indicating an error bit among bits constituting the error byte indicated by the error location, the error magnitude being computed by either of said Eucledean algorithm computer or said error location computer by using the error location polynomial and the error evaluation polynomial;
    wherein said correction state monitor to monitor said Eucledean algorithm computer and said error location computer, generate a signal indicating the presence or absence of a process error in each of said Eucledean algorithm computer and said error location computer, and generate a signal indicating the degree of error in the input data from the error location and the error magnitude;
    wherein said correction state monitor comprises:
        an error bit number counter operable to count the number of the error bits indicated by the error magnitude;
        a synchronous signal counter operable to count synchronous byte suggestion signals which are output in synchronization with synchronous signals of the input data;
        a bit error rate computer operable to compute a bit error rate from the total number of bits in data which is input to said Reed-Solomon decoding apparatus and the number of the error bits which are counted by said error bit number counter while said synchronous signal counter counts a predetermined number of synchronous byte suggestion signals;
        an error symbol number counter operable to count the number of the error bytes indicated by the error location; and
        a symbol error rate computer operable to compute a symbol error rate from the total number of symbols in data which is input to said Reed-Solomon decoding apparatus and the number of the error symbols which are counted by said error symbol number counter while a predetermined number of synchronous byte suggestion signals which are output in synchronization with synchronous signals of the input data are counted;
    wherein the signal indicating the degree of error in the input data includes the bit error rate and the symbol error rate; and
    wherein plural assumable ranges of the error symbol number are previously set, and said symbol error rate computer comprises:
        a determined unit operable to determine a range including the number of the error symbols which are counted by said error symbol number counter while the predetermined number of synchronous byte suggestion signals are counted in the set ranges; and an error rate output unit operable to previously compute symbol error rates from values, each of which is arbitrarily selected from each of the ranges set in said determining unit, and the total number of symbols in the input data, and output a symbol error rate corresponding to the range determined by said determining unit from the previously computed symbol error rates.

3. A Reed-Solomon decoding apparatus comprising:

a Reed-Solomon decoder operable to perform error correction for input data with a Reed-Solomon code;

a correction state monitor operable to detect a process error in the error correction by said Reed-Solomon decoder and monitor a degree of error in the input data;

wherein said Reed-Solomon decoder comprises:
   a syndrome computer operable to compute a syndrome from the input data;
   an Eucledean algorithm computer operable to compute an error location polynomial and an error evaluation polynomial using the syndrome;
   an error location computer operable to compute an error location indicating an error byte in the input data from the error location polynomial and the error evaluation polynomial; and
   an error corrector operable to correct the input data by using the error location and an error magnitude indicating an error bit among bits constituting the error byte indicated by the error location, the error magnitude being computed by either of said Eucledean algorithm computer or said error location computer by using the error location polynomial and the error evaluation polynomial;

wherein said correction state monitor is operable to monitor said Eucledean algorithm computer and said error location computer, generate a signal indicating the presence or absence of a process error in each of said Eucledean algorithm computer and said error location computer, and generate a signal indicating the degree of error in the input data from the error location and the error magnitude;

wherein said correction state monitor comprises:
   an error bit number counter operable to count the number of the error bits indicated by the error magnitude;
   a synchronous signal computer operable to count synchronous byte suggestion signals which are output in synchronization with synchronous signals of the input data;
   a bit error rate computer operable to compute a bit error rate from the total number of bits in data which is input to said Reed-Solomon decoding apparatus and the number of the error bits which are counted by said error bit number counter while said synchronous signal counter counts a predetermined number of synchronous byte suggestion signals;

wherein the signal indicating the degree of error in the input data includes the bit error rate; and wherein plural assumable ranges of the error bit number are previously set, and said bit error rate computer comprises:
   a determining unit operable to determine a range including the number of the error bits which are counted by said error bit number counter while the predetermined number of synchronous byte suggestion signals are counted in the set ranges; and
   an error rate output unit operable to previously compute bit error rates from values, each of which is arbitrarily selected from each of the ranges set in said determining unit, and the total number of bits in the input data, and output a bit error rate corresponding to the range determined by said determining unit from the previously computed bit error rates.

4. A Reed-Solomon decoding apparatus as claimed in claim 3, wherein said correction state monitor comprises:
   an error symbol number counter operable to count the number of the error bytes indicated by the error location; and
   a symbol error rate computer operable to compute a symbol error rate from the total number of symbols in data which is input to said Reed-Solomon decoding apparatus and the number of the error symbols which are counted by said error symbol number counter while a predetermined number of synchronous byte suggestion signals which are output in synchronization with synchronous signals of the input data are counted;

wherein the signal indicating the degree of error in the input data includes the symbol error rate.

5. A Reed-Solomon decoding apparatus as claimed in claim 4, wherein said symbol error rate computer comprises:
   a divider operable to divide the number of the error symbols by the total number of symbols in the input data.

6. A Reed-Solomon decoding apparatus as claimed in claim 5, wherein said symbol error rate computer comprises:
   a constant output unit operable to previously compute the total number of symbols in data which is to be input to said Reed-Solomon decoding apparatus while the predetermined number of synchronous byte suggestion signals are counted and, when said synchronous signal counter counts the predetermined number of synchronous byte suggestion signals, output the previously computed total number of symbols.

7. A Reed-Solomon decoding apparatus as claimed in claim 4, wherein plural assumable ranges of the error symbol number are previously set, and said symbol error rate computer comprises:
   a determining unit operable to determine a range including the number of the error symbols which are counted by said error symbol number counter while the predetermined number of synchronous byte suggestion signals are counted in the set ranges; and
   an error rate output unit operable to previously compute symbol error rates from values, each of which is arbitrarily selected from each of the ranges in said determining unit, and the total number of symbols in the input data, and output a symbol error rate corresponding to the range determined by said determining unit from the previously computed symbol error rates.

8. A Reed-Solomon decoding apparatus comprising:

a Reed-Solomon decoder operable to perform error correction for input data with a Reed-Solomon code;

a correction state monitor operable to detect a process error in the error correction by said Reed-Solomon decoder and monitor a degree of error in the input data;

wherein said Reed-Solomon decoder comprises:
   a syndrome computer operable to compute a syndrome from the input data;
   an Eucledean algorithm computer operable to compute an error location polynomial and an error evaluation polynomial using the syndrome;

an error location computer operable to compute an error location indicating an error byte in the input data from the error location polynomial and the error evaluation polynomial; and an error corrector operable to correct the input data by using the error location and an error magnitude indicating an error bit among bits constituting the error byte indicated by the error location, the error magnitude being computed by either of said Eucledean algorithm computer of said error location computer by using the error location polynomial and the error evaluation polynomial;

wherein said correction state monitor is operable to monitor said Eucledean algorithm computer and said error location computer, generate a signal indicating the presence or absence of a process error in each of said Eucledean algorithm computer and said error location computer, and generate a signal indicating the degree of error in the input data from the error location and the error magnitude;

wherein said correction state monitor comprises:
an error bit number counter operable to count the number of the error bits indicated by the error magnitude;
a synchronous signal counter operable to count synchronous byte suggestion signals which are output in synchronization with synchronous signals of the input data;
a bit error rate computer operable to compute a bit error rate from the total number of bits in data which is input to said Reed-Solomon decoding apparatus and the number of the error bits which are counted by said error bit number counter while said synchronous signal counter counts a predetermined number of synchronous byte suggestion signals;

wherein the signal indicating the degree of error in the input data includes the bit error rate;

wherein said bit error rate computer comprises:
a divider operable to divide the number of the error bits by the total number of bits in the input data; and
a constant output unit operable to previously compute the total number of bits in data which is to be input to said Reed-Solomon decoding apparatus while the predetermined number of synchronous byte suggestion signals are counted and, when said synchronous signal counter counts the predetermined number of synchronous byte suggestion signals, output the previously computed total number of bits;

wherein said correction state monitor comprises:
an error symbol number counter operable to count the number of the error bytes indicated by the error location; and
a symbol error rate computer operable to compute a symbol error rate from the total number of symbols in data which is input to said Reed-Solomon decoding apparatus and the number of the error symbols which are counted by said error symbol number counter while a predetermined number of synchronous byte suggestion signals which are output in synchronization with synchronous signals of the input data are counted;

wherein the signal indicating the degree of error in the input data includes the symbol error rate; and wherein plural assumable ranges of the error symbol number are previously set and said symbol error rate computer comprises:

a determining unit operable to determine a range including the number of the error symbols which are counted by said error symbol number counter while the predetermined number of synchronous byte suggestion signals are counted in the set ranges; and an error rate output unit operable to previously compute symbol error rates from values, each of which is arbitrarily selected from each of the ranges set in said determining unit and the total number of symbols in the input data, and output a symbol error rate corresponding to the range determined by said determining unit from the previously computed symbol error rates.

9. A Reed-Solomon decoding apparatus comprising:
a Reed-Solomon decoder operable to perform error correction for input data with a Reed-Solomon code;
a correction state monitor operable to detect a process error in the error correction by said Reed-Solomon decoder and monitor a degree of error in the input data;
wherein said Reed-Solomon decoder comprises:
a syndrome computer operable to compute a syndrome from the input data;
an Eucledean algorithm computer operable to computer an error location polynomial and an error evaluation polynomial using the syndrome;
an error location computer operable to compute an error location indicating an error byte in the input data from the error location polynomial and the error evaluation polynomial; and
an error corrector operable to correct the input data by using the error location and an error magnitude indicating an error bit among bits constituting the error byte indicated by the error location, the error magnitude being computed by either of said Eucledean algorithm computer or said error location computer by using the error location polynomial and the error evaluation polynomial;

wherein said correction state monitor is operable to monitor said Eucledean algorithm computer and said error location computer, generate a signal indicating the presence or absence of a process error in each of said Eucledean algorithm computer and said error location computer, and generate a signal indicating the degree of error in the input data from the error location and the error magnitude;

wherein said correction state monitor comprises:
an error bit number counter operable to count the number of the error bits indicated by the error magnitude;
a synchronous signal counter operable to count synchronous byte suggestion signals which are output in synchronization with synchronous signals of the input data;
a bit error rate computer operable to compute a bit error rate from the total number of bits in data which is input to said Reed-Solomon decoding apparatus and the number of the error bits which are counted by said error bit number counter while said synchronous signal counter counts a predetermined number of synchronous byte suggestion signals;

wherein the signal indicating the degree of error in the input data includes the bit error rate;

wherein said bit error rate computer comprises:
a divider operable to divide the number of the error bits by the total number of bits in the input data;

wherein said correction state monitor comprises:

an error symbol number counter operable to count the number of the error bytes indicated by the error location; and a symbol error rate computer operable to compute a symbol error rate from the total number of symbols in data which is input to said Reed-Solomon decoding apparatus and the number of the error symbols which are counted by said error symbol number counter while a predetermined number of synchronous byte suggestion signals which are output in synchronization with synchronous signals of the input data are counted; and wherein the signal indicating the degree of error in the input data includes the symbol error rate; and wherein plural assumable ranges of the error symbol number are previously set, and said symbol error rate computer comprises:

a determining unit operable to determine a range including the number of the error symbols which are counted by said error symbol number counter while the predetermined number of synchronous byte suggestion signals are counted in the set ranges; and an error rate output unit operable to previously compute symbol error rates from values, each of which is arbitrarily selected from each of the ranges set in said determining unit, and the total number of symbols in the input data, and output a symbol error rate corresponding to the range determined by said determining unit from the previously computed symbol error rates.

10. A method for controlling a Reed-Solomon decoding apparatus which performs error correction for input data with a Reed-Solomon code, said method comprising:

computing a syndrome from the input data;

computing an error location polynomial and an error evaluation polynomial using the syndrome;

computing an error location indicating an error byte in the input data from the error location polynomial and the error evaluation polynomial;

computing an error magnitude indicating an error bit among bits constituting the error byte indicated by the error location by using the error location polynomial and the error evaluation polynomial;

correcting the input data using the error location and the error magnitude; and monitoring said computing an error location polynomial, said computing an error location, and said computing an error magnitude, generating a signal indicating the presence or absence of a process error, and generating a signal indicating the degree of error in the input data from the error location and the error magnitude, wherein said monitoring comprises:

counting the number of the error bits indicated by the error magnitude;

counting synchronous byte suggestion signals which are output in synchronization with synchronous signals of the input data;

computing a bit error rate from the total number of bits in data which is input to the Reed-Solomon decoding apparatus and the number of the error bits which are counted in said counting the number of error bits while a predetermined number of the synchronous byte suggestion signals are counted in said counting synchronous byte suggestion signals;

counting the number of the error bytes indicated by the error location; and computing a symbol error rate from the total number of symbols in data which is input to the Reed-Solomon decoding apparatus while a predetermined number of synchronous byte suggestion signals which are output in synchronization with synchronous signals of the input data are counted and the number of the error symbols counted in said counting the number of the error bytes while the predetermined number of synchronous byte suggestion signals are counted;

wherein the signal indicating the degree of error in the input data includes the bit error rate and the symbol error rate; and wherein said computing the symbol error rate comprises:

previously setting plural assumable ranges of the error symbol number, and determining a range including the number of the error symbols counted in said counting the number of the error bits while the predetermined number of synchronous byte suggestion signals are counted in the set ranges; and previously computing symbol error rates from values, each of which is arbitrarily selected from each of the ranges set in said previously setting plural assumable ranges, and the total number of symbols in the input data, and when a range is determined in said previously setting plural assumable ranges, outputting a symbol error rate corresponding to the determined range from the previously computed symbol error rates.

11. A computer readable program comprising program code for enabling a computer to perform the method as claimed in claim 10.

12. A method for controlling a Reed-Solomon decoding apparatus which performs error correction for input data with a Reed-Solomon code, said method comprising:

computing a syndrome from the input data;

computing an error location polynomial and an error evaluation polynomial using the syndrome;

computing an error location indicating an error byte in the input data from the error location polynomial and the error evaluation polynomial;

computing an error magnitude indicating an error bit among bits constituting the error byte indicated by the error location by using the error location polynomial and the error evaluation polynomial;

correcting the input data using the error location and the error magnitude; and monitoring said computing an error location polynomial, said computing an error location, and said computing an error magnitude, generating a signal indicating the presence or absence of a process error, and generating a signal indicating the degree of error in the input data from the error location and the error magnitude, wherein said monitoring comprises:

counting the number of the error bits indicated by the error magnitude;

counting synchronous byte suggestion signals which are output in synchronization with synchronous signals of the input data; and computing a bit error rate from the total number of bits in data which is input to the Reed-Solomon decoding apparatus and the number of the error bits which are counted in said counting the number of error bits while a predetermined number of the synchronous byte suggestion signals are counted in said counting synchronous byte suggestion signals;

wherein the signal indicating the degree of error in the input data includes the bit error rate; and wherein said computing the bit error rate comprises:
previously setting plural assumable ranges of the error bit number, and
determining a range including the number of the error bits which are counted in said counting the number of the error bits while the predetermined number of synchronous byte suggestion signals are counted in the set ranges; and
previously computing bit error rates from values, each of which is arbitrarily selected from each of the ranges set in said previously setting plural assumable ranges, and the total number of bits in the input data, and when a range is determined in said previously setting plural assumable ranges, outputting a bit error rate corresponding to the determined range from the previously computed bit error rates.

13. A method as claimed in claim 12, wherein said monitoring comprises:
counting the number of the error bytes indicated by the error location; and
computing a symbol error rate from the total number of symbols in data which is input to the Reed-Solomon decoding apparatus while a predetermined number of synchronous byte suggestion signals which are output in synchronization with synchronous signals of the input data are counted and the number of the error symbols counted in said counting the number of the error bytes while the predetermined number of synchronous byte suggestion signals are counted;
wherein the signal indicating the degree of error in the input data includes the symbol error rate.

14. A method as claimed in claim 13 wherein said computing a symbol error rate comprises:
previously setting plural assumable ranges of the error symbol number, and determining a range including the number of the error symbols counted in said counting the number of the error bytes while the predetermined number of synchronous byte suggestion signals are counted in the set ranges; and
previously computing symbol error rates from values, each of which is arbitrarily selected from each of the ranges set in said previously setting plural assumable ranges, and the total number of symbols in the input data, and when a range is determined in said previously setting plural assumable ranges, outputting a symbol error rate corresponding to the determined range from the previously computed symbol error rates.

15. A computer readable program comprising program code for enabling a computer to perform the method as claimed in claim 14.

16. A method for controlling a Reed-Solomon decoding apparatus which performs error correction for input data with a Reed-Solomon code, said method comprising:
computing a syndrome from the input data;
computing an error location polynomial and an error evaluation polynomial using the syndrome;
computing an error location indicating an error byte in the input data from the error location polynomial and the error evaluation polynomial;
computing an error magnitude indicating an error bit among bits constituting the error byte indicated by the error location by using the error location polynomial and the error evaluation polynomial;
correcting the input data using the error location and the error magnitude; and
monitoring said computing an error location polynomial, said computing an error location, and said computing an error magnitude, generating a signal indicating the presence or absence of a process error, and generating a signal indicating the degree of error in the input data from the error location and the error magnitude, wherein said monitoring comprises:
counting the number of the error bytes indicated by the error location; and
computing a symbol error rate from the total number of symbols in data which is input to the Reed-Solomon decoding apparatus while a predetermined number of synchronous byte suggestion signals which are output in synchronization with synchronous signals of the input data are counted and the number of the error symbols counted in said counting the number of the error bytes while the predetermined number of synchronous byte suggestion signals are counted;
wherein the signal indicating the degree of error in the input data includes the symbol error rate; and
wherein said computing the symbol error rate comprises:
previously setting plural assumable ranges of the error signal number, and determining a range including the number of the error symbols counted in said counting the number of the error bytes while the predetermined number of synchronous byte suggestion signals are counted in the set ranges; and
previously computing symbol error rates from values, each of which is arbitrarily selected from each of the ranges set in said previously setting plural assumable ranges and the total number of symbols in the input data, and when a range is determined in said previously setting plural assumable ranges, outputting a symbol error rate corresponding to the determined range from the previously computed symbol error rates.

17. A computer readable program comprising program code for enabling a computer to perform the method as claimed in claim 16.

* * * * *